United States Patent [19]
Suh

[11] Patent Number: 5,923,607
[45] Date of Patent: Jul. 13, 1999

[54] APPARATUS AND METHOD FOR ENLARGING METAL LINE PITCH OF SEMICONDUCTOR MEMORY DEVICE

[75] Inventor: Jung Won Suh, Ichon-shi, Rep. of Korea

[73] Assignee: Hyundai Electronics Industries Co., Ltd., Kyoungki-do, Rep. of Korea

[21] Appl. No.: 08/966,199

[22] Filed: Nov. 7, 1997

[30] Foreign Application Priority Data

Nov. 13, 1996 [KR] Rep. of Korea ............... 96-53612

[51] Int. Cl.⁶ ............................................. G11C 8/00
[52] U.S. Cl. ........................... 365/230.03; 365/230.01
[58] Field of Search ..................... 365/230.01, 230.03, 365/222

[56] References Cited

U.S. PATENT DOCUMENTS

| | | | |
|---|---|---|---|
| 5,297,090 | 3/1994 | McClure | 365/203 |
| 5,539,700 | 7/1996 | Kawahara et al. | 365/203 |
| 5,594,704 | 1/1997 | Konishi et al. | 365/233 |
| 5,717,645 | 2/1998 | Kengeri et al. | 365/230.01 |
| 5,748,547 | 5/1998 | Shau | 365/222 |

*Primary Examiner*—David Nelms
*Assistant Examiner*—M. Tran
*Attorney, Agent, or Firm*—Gary M. Nath; Nath & Associates

[57] ABSTRACT

An apparatus and a method for enlarging a metal line pitch of a semiconductor memory device. The metal line enlargement apparatus comprises a first transfer circuit for transferring data amplified by bit line sense amplifiers to data bus lines in response to an output signal from a column decoder, and a second transfer circuit for transferring the data amplified by the bit line sense amplifiers to the first transfer circuit in response to first and second bit line sense amplifier group selection signals which are generated by decoding a column address. According to the present invention, the bit line sense amplifiers are effectively connected to the data bus lines to increase layout and output line pitches of the column decoder. Therefore, a design margin in a cell core region can be secured and a difficulty in a metal process can be reduced.

12 Claims, 7 Drawing Sheets

APPARATUS AND METHOD FOR ENLARGING METAL LINE PITCH OF SEMICONDUCTOR MEMORY DEVICE

BACKGROUND OF THE INVENTION

1. Field of the Invention

The present invention relates in general to the effective connection between bit line sense amplifiers and data bus lines in a semiconductor memory device for securing a design margin in a cell core region and reducing a difficulty in a metal process, and more particularly to an apparatus and a method for enlarging a metal line pitch of a semiconductor memory device, in which bit line sense amplifiers are effectively connected to data bus lines to increase layout and output line pitches of a column decoder. The present apparatus and method are applicable to a very large-scale integrated memory device of the Gigabit (Gb) class to increase layout and output line pitches of a column decoder, so as to secure a margin in a metal process.

2. Description of the Prior Art

Generally, in a metal process, a resistance of a word line of poly-silicon is reduced by disposing a metal line thereon and connecting it thereto.

However, the metal line cannot secure a margin in the metal process because of a word line pitch, resulting in a considerable reduction in yield of a semiconductor memory device. In particular, a semiconductor memory device of the Gb class has a difficulty in the metal process because of reduced layout and output line pitches of a column decoder.

For this reason, a hierarchical word line structure has essentially been applied to semiconductor memory devices, beginning with a 64 Mb dynamic random access memory, to increase a metal line pitch, so as to secure a margin in the metal process.

Figure 1:
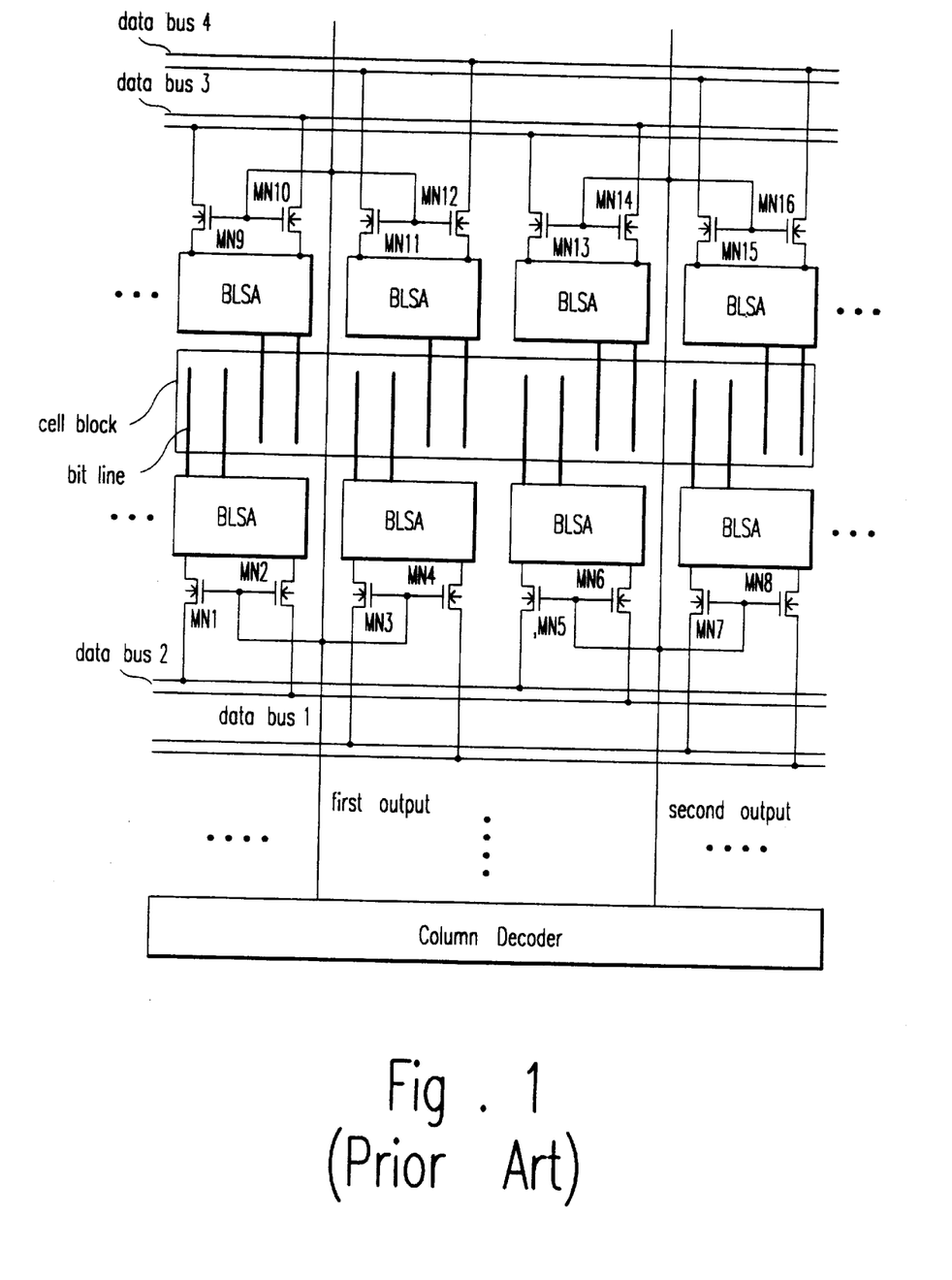
FIG. 1 is a circuit diagram illustrating a conventional connection between bit line sense amplifiers and data bus lines in a semiconductor memory device.

FIG. 1 is a circuit diagram illustrating a conventional connection between bit line sense amplifiers and data bus lines in a semiconductor memory device. In this drawing, there is shown only one cell block with a cell array folded bit line structure.

In FIG. 1, a first output line of a column decoder is adapted to select four of eight bit line sense amplifiers and connect them respectively to four data bus lines. Similarly, a second output line of the column decoder is adapted to select the remaining four bit line sense amplifiers and connect them respectively to the four data bus lines. In this connection, an output line pitch of the column decoder is eight times as long as a bit line pitch.

Hence, the above-mentioned conventional construction has no particular problem in layout and output line pitches of the column decoder.

However, in a semiconductor memory device of the Gb class such as, for example, at least 4 Gb or 16 Gb, a bit line pitch is considerably reduced. For this reason, it is difficult for the above-mentioned conventional construction to be applied to the design of the column decoder and the metal process of the output lines thereof.

In other words, in the case where the above-mentioned conventional construction is applied to a very large-scale integrated memory device of the Gb class, the bit line pitch is considerably reduced, resulting in difficulties in the design of the column decoder and the metal process of the output lines thereof.

SUMMARY OF THE INVENTION

Therefore, the present invention has been made in view of the above problem, and it is an object of the present invention to provide an apparatus and a method for enlarging a metal line pitch of a semiconductor memory device, in which bit line sense amplifiers are effectively connected to data bus lines to increase layout and output line pitches of a column decoder, so that a design margin in a cell core region can be secured and a difficulty in a metal process can be reduced.

In accordance with one aspect of the present invention, there is provided a metal line pitch enlargement apparatus for a semiconductor memory device, the memory device having a memory cell array including a plurality of cell blocks, a plurality of pairs of bit line sense amplifier arrays, each of the pairs of bit line sense amplifier (BLSA) arrays being connected to a corresponding one of the cell blocks, and a column decoder for decoding a column address of A bits to generate $2^A$ outputs, comprising first transfer means for transferring data amplified by one of the pairs of bit line sense amplifier arrays connected to a desired one of the cell blocks to data bus lines in response to an output signal from the column decoder, the first transfer means including a plurality of MOS transistors having their gates connected in common to an output line of the column decoder; and second transfer means for transferring the data amplified by the bit line sense amplifier array pair connected to the desired cell block to the first transfer means in response to $2^B$ bit line sense amplifier group selection signals, the $2^B$ bit line sense amplifier group selection signals being generated by decoding B bits of the column address; whereby $2^M$ bit line sense amplifiers in each of the bit line sense amplifier arrays are selected by the output signal from the column decoder and grouped into $2^B$, and $2^{M-B}$ thereof are then selectively connected to the data bus lines.

In accordance with another aspect of the present invention, there is provided a metal line pitch enlargement apparatus for a semiconductor memory device, comprising first transfer means for transferring data amplified by a plurality of bit line sense amplifiers in response to an output signal from a column decoder, the first transfer means including a plurality of first MOS transistors having their gates connected in common to an output line of the column decoder; and second transfer means for transferring the data transferred by the first transfer means to data bus lines in response to first and second bit line sense amplifier group selection signals.

In accordance with a further aspect of the present invention, there is provided a metal line pitch enlargement apparatus for a semiconductor memory device, the memory device having a memory cell array including a plurality of cell blocks, a plurality of pairs of bit line sense amplifier arrays, each of the pairs of bit line sense amplifier arrays being connected to a corresponding one of the cell blocks, and a column decoder for decoding a column address of A bits to generate $2^A$ outputs, comprising first transfer means for transferring data amplified by one of the pairs of bit line sense amplifier arrays connected to a desired one of the cell blocks in response to an output signal from the column decoder, the first transfer means including a plurality of first MOS transistors having their gates connected in common to an output line of the column decoder and a plurality of second MOS transistors; and second transfer means for transferring the data transferred by the first transfer means to data bus lines in response to first and second bit line sense amplifier group selection signals, the second transfer means including a plurality of third MOS transistors having their gates cross coupled respectively to the gates of the first MOS transistors in the first transfer means, a plurality of fourth MOS transistors having their gates for commonly inputting the first bit line sense amplifier group selection signal and cross coupled respectively to gates of half of the second MOS transistors in the first transfer means and a plurality of fifth MOS transistors having their gates for commonly inputting the second bit line sense amplifier group selection signal and cross coupled respectively to gates of the remaining half of the second MOS transistors in the first transfer means; whereby data amplified by half of a plurality of bit line sense amplifiers in each of the bit line sense amplifier arrays are transferred to the data bus lines in response to the first bit line sense amplifier group selection signal and data amplified by the remaining half of the bit line sense amplifiers are transferred to the data bus lines in response to the second bit line sense amplifier group selection signal.

In accordance with yet another aspect of the present invention, there is provided a method for enlarging a metal line pitch of a semiconductor memory device, the memory device having a memory cell array including a plurality of cell blocks, a plurality of pairs of bit line sense amplifier arrays, each of the pairs of bit line sense amplifier arrays being connected to a corresponding one of the cell blocks, and a column decoder for decoding a column address of A bits to generate $2^A$ outputs, comprising the first step of selecting $2^M$ bit line sense amplifiers in each of the bit line sense amplifier arrays in response to an output signal from the column decoder; the second step of grouping the selected $2^M$ bit line sense amplifiers into $2^B$ using $2^B$ horizontal bit line sense amplifier group selection lines; the third step of connecting $2^B$ vertical bit line sense amplifier group selection lines respectively to the $2^B$ horizontal bit line sense amplifier group selection lines in response to a block selection signal; and the fourth step of decoding B bits of the column address to generate $2^B$ bit line sense amplifier group selection signals and transferring the generated $2^B$ bit line sense amplifier group selection signals to the $2^B$ horizontal bit line sense amplifier group selection lines through the $2^B$ vertical bit line sense amplifier group selection lines, respectively.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 2:
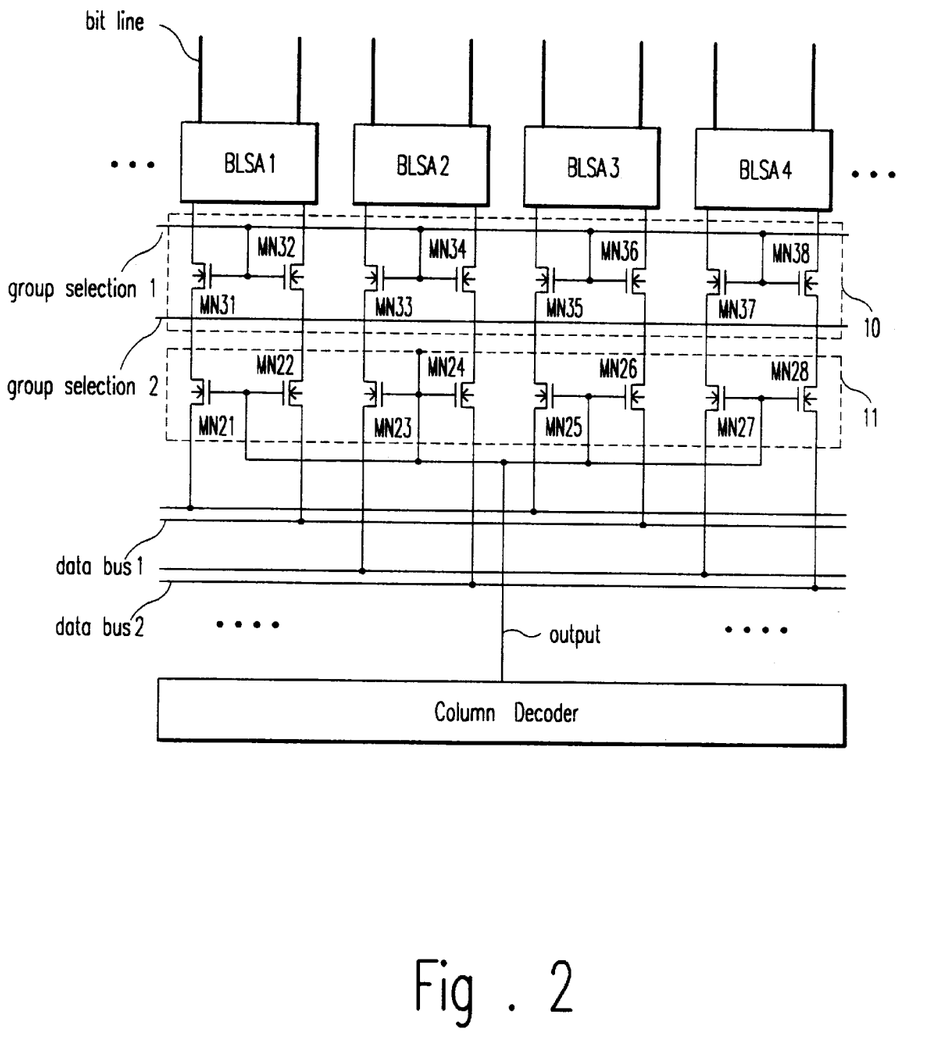
FIG. 2 is a circuit diagram of a metal line pitch enlargement apparatus for a semiconductor memory device in accordance with a first embodiment of the present invention.

FIG. 2 is a circuit diagram of a metal line pitch enlargement apparatus for a semiconductor memory device in accordance with a first embodiment of the present invention. In this drawing, first to fourth bit line sense amplifiers (BLSA) are adapted to amplify data from a cell block and output the amplified data to data bus lines. A second transfer circuit 10 is adapted to transfer the output data from the bit line sense amplifiers to a first transfer circuit 11. The first transfer circuit 11 is adapted to transfer the data transferred by the second transfer circuit 10 to the data bus lines. A column decoder has a single output line connected in common to gates of NMOS transistors MN21–MN28 in the first transfer circuit 11.

The operation of the metal line pitch enlargement apparatus with the above-mentioned construction in accordance with the first embodiment of the present invention will hereinafter be described in detail.

If the output signal from the column decoder is high in logic, the NMOS transistors MN21–MN28 in the first transfer circuit 11 are simultaneously turned on.

Noticeably, in the conventional connection between the bit line sense amplifiers and data bus lines in the semiconductor memory device as shown in FIG. 1, two of the four bit line sense amplifiers under the cell block are connected to the first output line of the column decoder and the remaining two bit line sense amplifiers are connected to the second output line of the column decoder. As a result, different amplified data from the bit line sense amplifiers are not simultaneously transferred to the first or second data bus line. However, in the first embodiment of the present invention, the four bit line sense amplifiers under the cell block are connected in common to the single output line of the column decoder, so that they can simultaneously be turned on in response to the output signal from the column decoder. As a result, different amplified data from the bit line sense amplifiers may simultaneously be transferred to the first or second data bus line.

To solve the above problem, in the first embodiment of the present invention, first and second bit line sense amplifier group selection signals are generated on the basis of an enable signal and a column address signal. Also, a plurality of NMOS transistors MN31–MN38 are provided in the second transfer circuit 10 to be selectively turned on in response to the first and second bit line sense amplifier group selection signals to prevent different amplified data from the bit line sense amplifiers from being simultaneously transferred to the first or second data bus line.

In the case where the first bit line sense amplifier group selection signal is high in logic and the second bit line sense amplifier group selection signal is low in logic under the condition that the NMOS transistors MN21–MN28 in the first transfer circuit 11 are simultaneously turned on, the NMOS transistors MN31–MN34 in the second transfer circuit 10 connected to a first bit line sense amplifier group selection line are turned on to transfer the data amplified by the first and second bit line sense amplifiers respectively to the first and second data bus lines. In this case, the NMOS transistors MN35–MN38 in the second transfer circuit 10 connected to a second bit line sense amplifier group selection line are turned off, resulting in the transfer of no data.

The conventional construction in FIG. 1 and the first embodiment of the present invention in FIG. 2 have a difference point therebetween as follows.

In the conventional construction in FIG. 1, two of the four bit line sense amplifiers under the cell block are connected to the first output line of the column decoder and the remaining two bit line sense amplifiers are connected to the second output line of the column decoder. As a result, the output line pitch of the column decoder is reduced, thereby causing the above-mentioned problem.

However, in the first embodiment of the present invention in FIG. 2, the four bit line sense amplifiers under the cell block are connected in common to the single output line of the column decoder. As a result, the output line pitch of the column decoder is increased, thereby overcoming a difficulty in a metal process.

Figure 3:
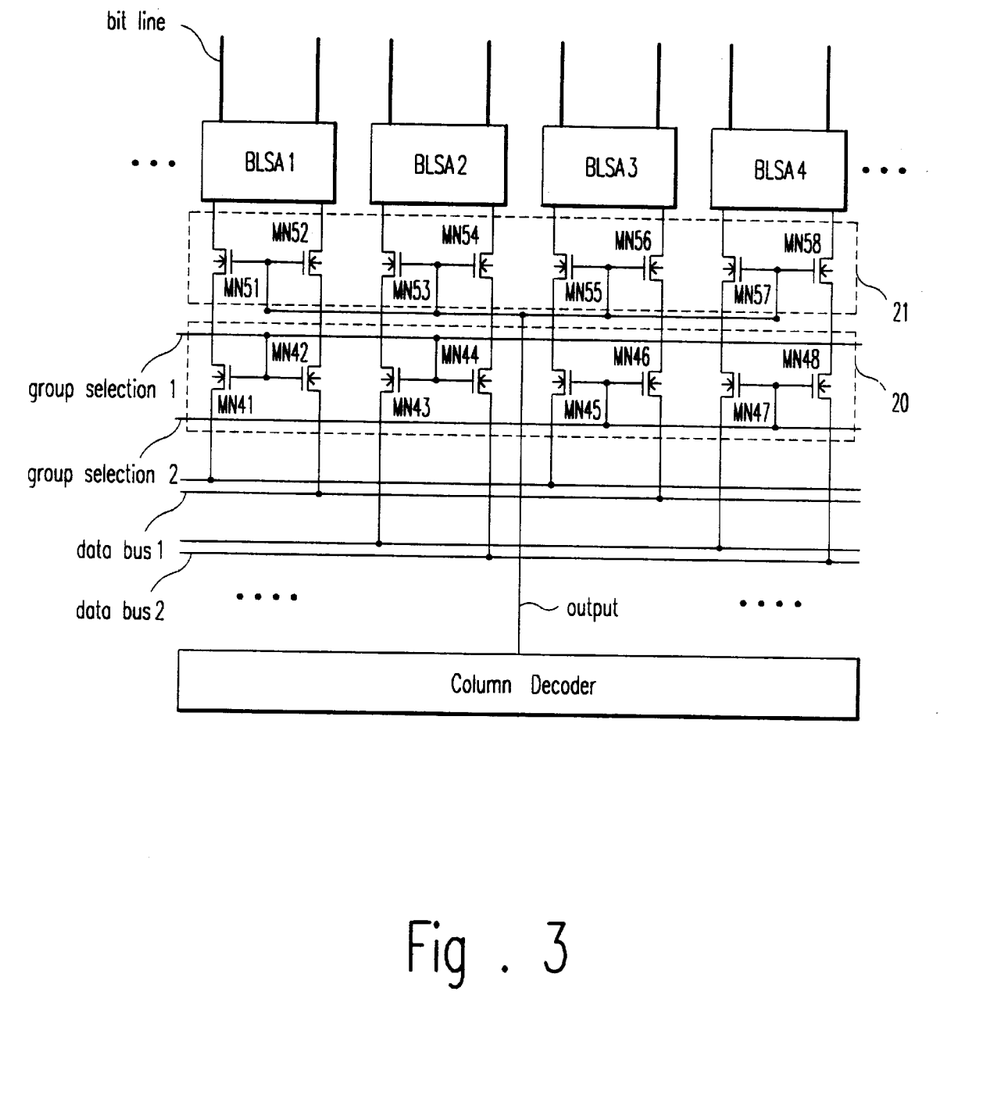
FIG. 3 is a circuit diagram of a metal line pitch enlargement apparatus for a semiconductor memory device in accordance with a second embodiment of the present invention.

FIG. 3 is a circuit diagram of a metal line pitch enlargement apparatus for a semiconductor memory device in accordance with a second embodiment of the present invention. The second embodiment of FIG. 3 is the same in construction and operation as the first embodiment of FIG. 2, with the exception that a first transfer circuit 21 is connected to the bit line sense amplifier output stage and a second transfer circuit 20 is connected between the first transfer circuit 21 and the data bus lines. Therefore, a description of the second embodiment will be omitted.

Figure 4:
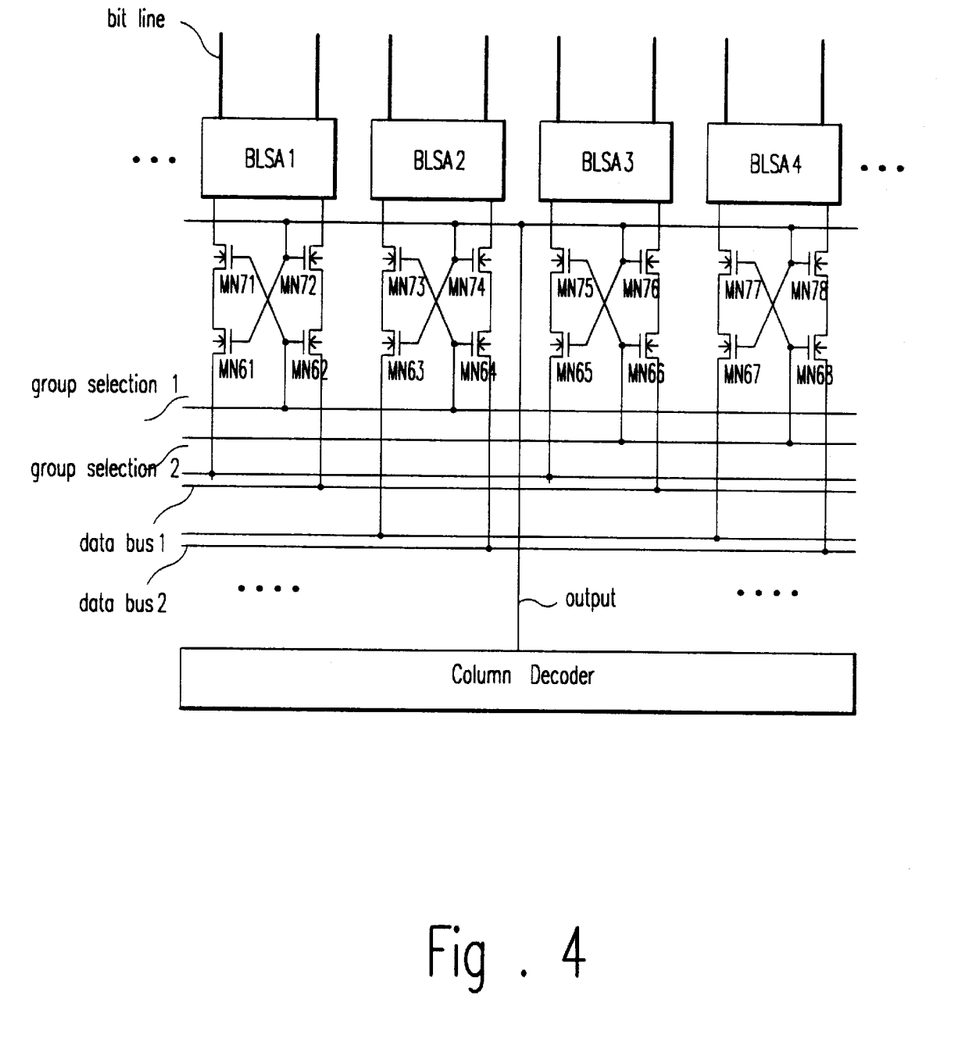
FIG. 4 is a circuit diagram of a metal line pitch enlargement apparatus for a semiconductor memory device in accordance with a third embodiment of the present invention.

FIG. 4 is a circuit diagram of a metal line pitch enlargement apparatus for a semiconductor memory device in accordance with a third embodiment of the present invention. The third embodiment of FIG. 4 is the same in construction and operation as the second embodiment of FIG. 3, with the exception that NMOS transistors in first and second transfer circuits have their cross coupled gates to each other. Therefore, a description of the third embodiment will be omitted.

The second and third embodiments of FIGS. 3 and 4 are proposed to suppress, at the maximum, an increase in area of a bit line sense amplifier array which has an important effect on the entire area of a chip.

Figure 5:
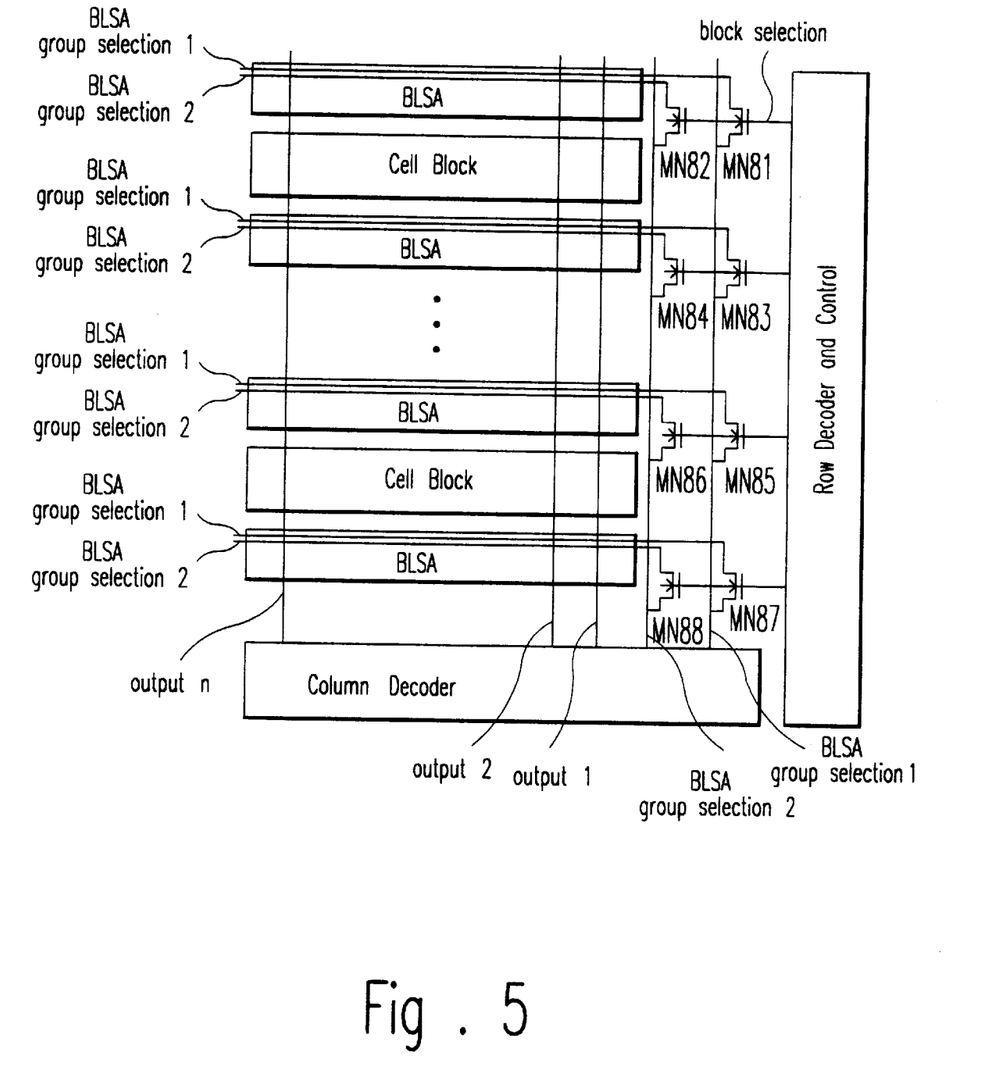
FIG. 5 is a block diagram illustrating an example of a cell array structure to which the present invention is applied.

FIG. 5 is a block diagram illustrating an example of a cell array structure to which the present invention is applied. As shown in this drawing, a plurality of pairs of bit line sense amplifier arrays each are disposed over and under a corresponding one of a plurality of cell blocks. Each of a plurality of first horizontal bit line sense amplifier group selection lines is connected to a corresponding of the bit line sense amplifier arrays. Each of a plurality of second horizontal bit line sense amplifier group selection lines is connected to a corresponding of the bit line sense amplifier arrays. First and second bit line sense amplifier group selection signals are generated by decoding a column address signal and transferred through first and second vertical bit line sense amplifier group selection lines to the first and second horizontal bit line sense amplifier group selection lines, respectively. Each of a plurality of NMOS transistors MN81, MN83, MN85 and MN87 is operated in response to a block selection signal from a row decoder/control circuit to connect the first vertical bit line sense amplifier group selection line to a corresponding one of the first horizontal bit line sense amplifier group selection lines. Each of a plurality of NMOS transistors MN82, MN84, MN86 and MN88 is operated in response to the block selection signal from the row decoder/control circuit to connect the second vertical bit line sense amplifier group selection line to a corresponding one of the second horizontal bit line sense amplifier group selection lines.

The operation of the above-mentioned construction in accordance with the present invention will hereinafter be described in detail.

Generally, if each cell block is selected, the upper and lower bit line sense amplifier arrays will be operated. To this end, the corresponding block selection signal is first made active to connect the first and second vertical bit line sense amplifier group selection lines respectively to the first and second horizontal bit line sense amplifier group selection lines of the upper and lower bit line sense amplifier arrays to be operated.

Thereafter, one of the first and second bit line sense amplifier group selection signals becomes high in logic and the other becomes low in logic. As a result, only half of the bit line sense amplifiers selected by the output signal from the column decoder are connected to the data bus lines. In view of timing, the first or second bit line sense amplifier group selection signal is first made active and the output signal from the column decoder is then made active.

In more detail, when a block selection signal is made active to select a desired cell block, the first and second vertical bit line sense amplifier group selection lines are connected respectively to the first and second horizontal bit line sense amplifier group selection lines of the upper and lower bit line sense amplifier arrays of the selected cell block by the associated transfer transistors. Then, the first and second vertical bit line sense amplifier group selection signals are generated by decoding a column address signal and transferred through the first and second vertical bit line sense amplifier group selection lines to the first and second horizontal bit line sense amplifier group selection lines of the upper and lower bit line sense amplifier arrays of the selected cell block. Noticeably, if the first and second vertical bit line sense amplifier group selection lines are not separated from the first and second horizontal bit line sense amplifier group selection lines by a block selection signal corresponding to a cell block, not selected, they are subjected to an overload, resulting in an increase in power consumption.

Figure 6:
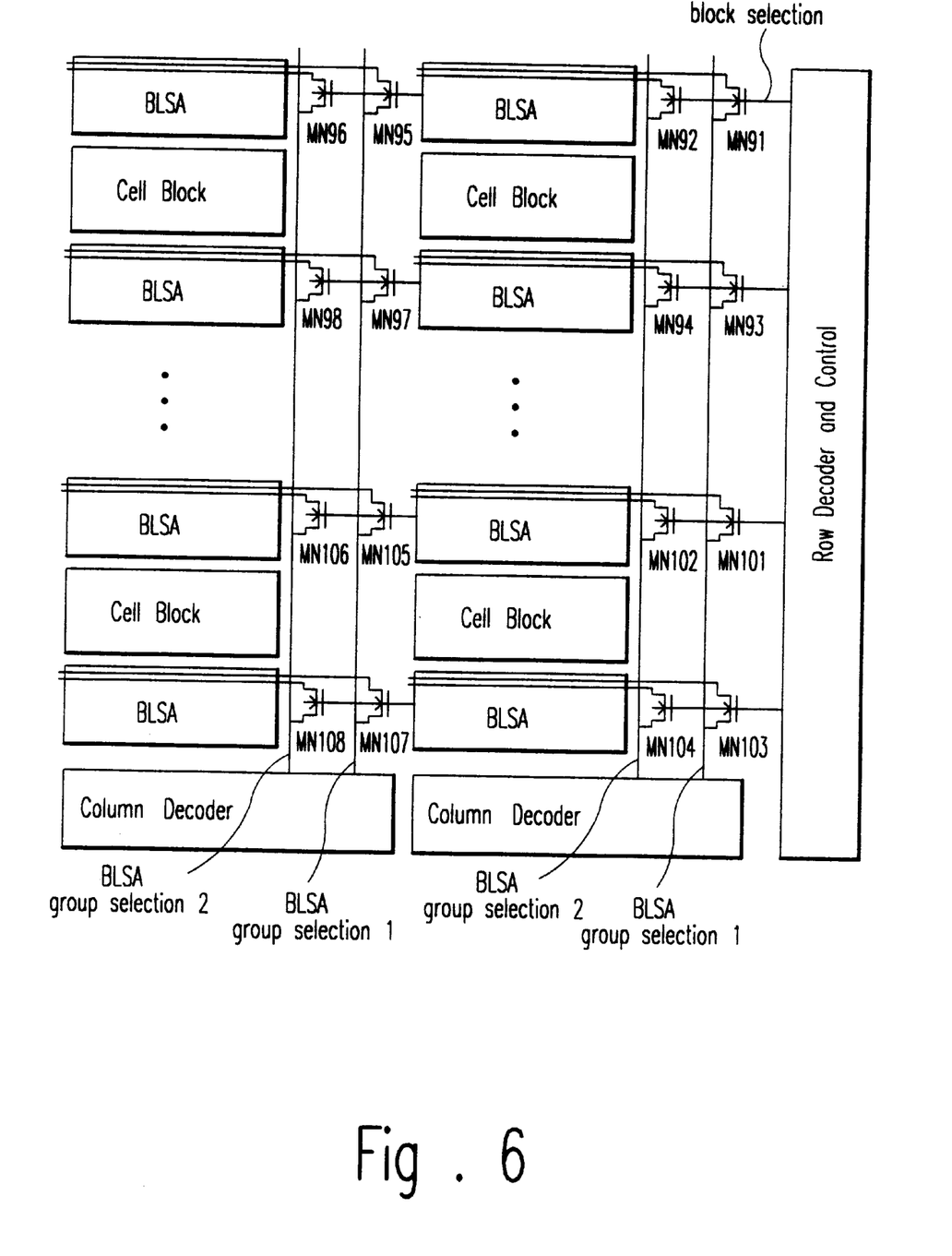
FIG. 6 is a block diagram illustrating another example of a cell array structure to which the present invention is applied.

FIG. 6 is a block diagram illustrating another example of a cell array structure to which the present invention is applied. In this drawing, a cell array is divided into a plurality of cell blocks in the column direction and first and second vertical bit line sense amplifier group selection lines are connected to the upper and lower bit line sense amplifier arrays of each of the cell blocks.

In FIG. 6, a block selection signal is shared by a plurality of transistors. For example, the block selection signal is shared by NMOS transistors MN91–MN98. The sharing of the block selection signal is similarly applied to the remaining cell blocks.

Figure 7:
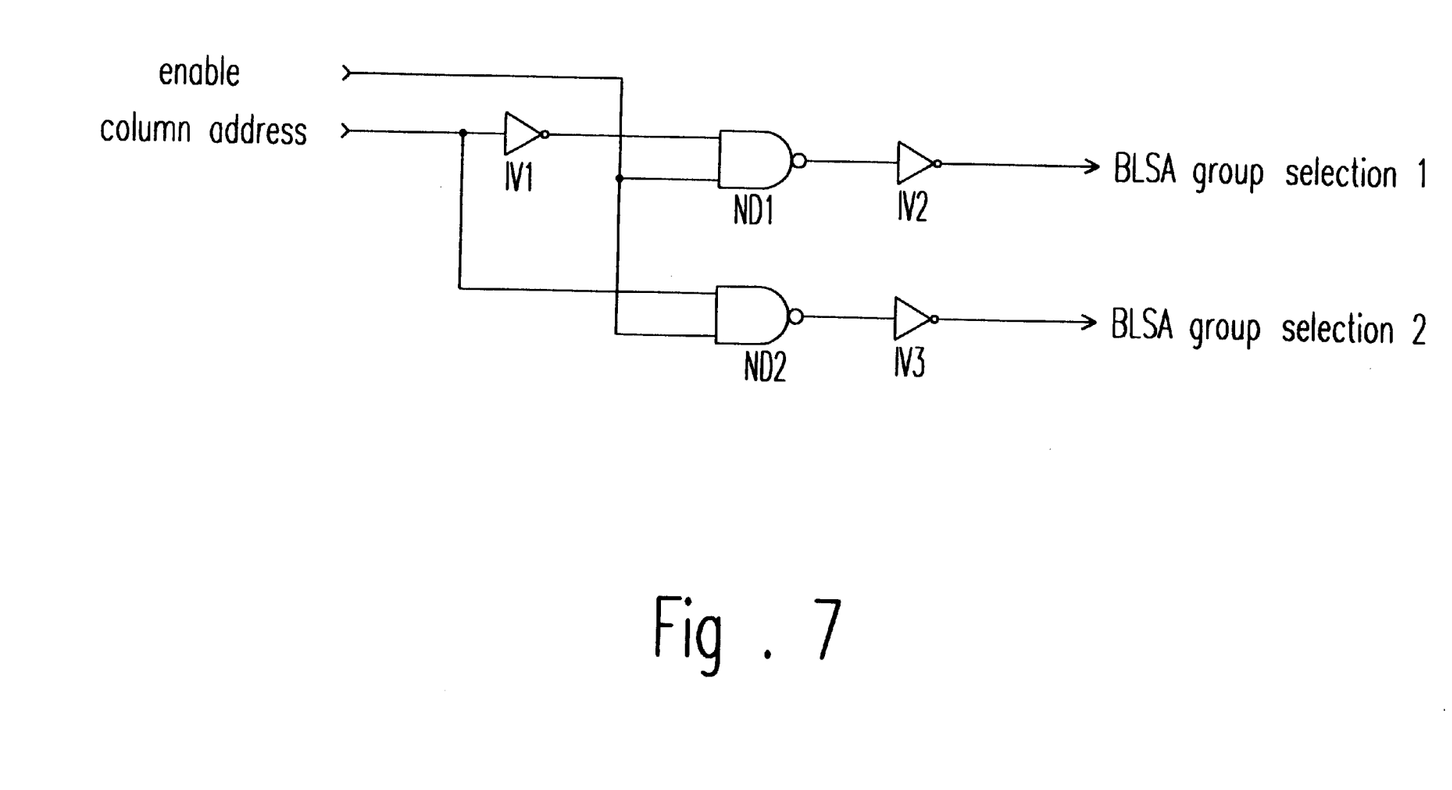
FIG. 7 is a circuit diagram of a bit line sense amplifier group selection signal generator in accordance with the present invention.

FIG. 7 is a circuit diagram of a bit line sense amplifier group selection signal generator in accordance with the present invention. As shown in this drawing, the bit line sense amplifier group selection signal generator includes a first inverter IV1 for inverting a column address signal, a first NAND gate ND1 for NANDing an output signal from the first inverter IV1 and an enable signal, a second inverter IV2 for inverting an output signal from the first NAND gate ND1 and outputting the inverted signal as the first bit line sense amplifier group selection signal, a second NAND gate ND2 for NANDing the enable signal and the column address signal, and a third inverter IV3 for inverting an output signal from the second NAND gate ND2 and outputting the inverted signal as the second bit line sense amplifier group selection signal.

In FIG. 7, the first and second bit line sense amplifier group selection signals are generated by decoding the column address signal when the enable signal is made active. The activation of the enable signal is made only when a read or write operation of a selected cell array is performed.

As a result, in the case where the cell array is at a standby state, the enable signal becomes low in logic, thereby causing the first and second bit line sense amplifier group selection signals to become both low in logic. On the other hand, low-order bits of a column address are successively varied when a burst read or write operation is performed. For this reason, the first and second bit line sense amplifier group selection signals are generated using high-order bits of the column address.

As apparent from the above description, according to the present invention, a layout pitch of the column decoder is increased to secure a design margin in a cell core region. Further, an output line pitch of the column decoder is increased to overcome a difficulty in a metal process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A metal line pitch enlargement apparatus for a semiconductor memory device, said memory device having a memory cell array including a plurality of cell blocks, a plurality of pairs of bit line sense amplifier arrays, each of said pairs of bit line sense amplifier arrays being connected to a corresponding one of said cell blocks, and a column decoder for decoding a column address of A bits to generate $2^A$ outputs, comprising:

first transfer means for transferring data amplified by one of said pairs of bit line sense amplifier arrays connected to a desired one of said cell blocks to data bus lines in response to an output signal from said column decoder, said first transfer means including a plurality of MOS transistors having their gates connected in common to an output line of said column decoder; and second transfer means for transferring the data amplified by said bit line sense amplifier array pair connected to said desired cell block to said first transfer means in response to $2^B$ bit line sense amplifier group selection signals, said $2^B$ bit line sense amplifier group selection signals being generated by decoding B bits of said column address;

whereby $2^M$ bit line sense amplifiers in each of said bit line sense amplifier arrays are selected by said output signal from said column decoder and grouped into $2^B$, and $2^{M-B}$ thereof are then selectively connected to said data bus lines.

2. A metal line pitch enlargement apparatus for a semiconductor memory device, as set forth in claim 1, wherein said B bits of said column address are high-order bits of said column address because low-order bits of said column address are successively varied when a burst read or write operation is performed.

3. A metal line pitch enlargement apparatus for a semiconductor memory device, comprising:

first transfer means for transferring data amplified by a plurality of bit line sense amplifiers in response to an output signal from a column decoder, said first transfer means including a plurality of first MOS transistors having their gates connected in common to an output line of said column decoder; and second transfer means for transferring the data transferred by said first transfer means to data bus lines in response to first and second bit line sense amplifier group selection signals, wherein said first transfer means and said second transfer means are located between said bit line sense amplifier and said data bus line.

4. A metal line pitch enlargement apparatus for a semiconductor memory device, as set forth in claim 3, wherein said second transfer means includes:

a plurality of second MOS transistors for transferring the data amplified by half of said bit line sense amplifiers to said data bus lines in response to said first bit line sense amplifier group selection signal, said second MOS transistors having their gates for commonly inputting said first bit line sense amplifier group selection signal; and a plurality of third MOS transistors for transferring the data amplified by the remaining half of said bit line sense amplifiers to said data bus lines in response to said second bit line sense amplifier group selection signal, said third MOS transistors having their gates for commonly inputting said second bit line sense amplifier group selection signal.

5. A metal line pitch enlargement apparatus for a semiconductor memory device, as set forth in claim 4, wherein said first to third MOS transistors are of an N type.

6. A metal line pitch enlargement apparatus for a semiconductor memory device, said memory device having a memory cell array including a plurality of cell blocks, a plurality of pairs of bit line sense amplifier arrays, each of said pairs of bit line sense amplifier arrays being connected to a corresponding one of said cell blocks, and a column decoder for decoding a column address of A bits to generate $2^A$ outputs, comprising:

first transfer means for transferring data amplified by one of said pairs of bit line sense amplifier arrays connected to a desired one of said cell blocks in response to an output signal from said column decoder, said first transfer means including a plurality of first MOS transistors having their gates connected in common to an output line of said column decoder and a plurality of second MOS transistors; and second transfer means for transferring the data transferred by said first transfer means to data bus lines in response to first and second bit line sense amplifier group selection signals, said second transfer means including a plurality of third MOS transistors having their gates cross coupled respectively to said gates of said first MOS transistors in said first transfer means, a plurality of fourth MOS transistors having their gates for commonly inputting said first bit line sense amplifier group selection signal and cross coupled respectively to gates of half of said second MOS transistors in said first transfer means and a plurality of fifth MOS transistors having their gates for commonly inputting said second bit line sense amplifier group selection signal and cross coupled respectively to gates of the remaining half of said second MOS transistors in said first transfer means;

whereby data amplified by half of a plurality of bit line sense amplifiers in each of said bit line sense amplifier arrays are transferred to said data bus lines in response to said first bit line sense amplifier group selection signal and data amplified by the remaining half of said bit line sense amplifiers are transferred to said data bus lines in response to said second bit line sense amplifier group selection signal.

7. A metal line pitch enlargement apparatus for a semiconductor memory device, as set forth in claim 6, wherein said first to fifth MOS transistors are of an N type.

8. A method for enlarging a metal line pitch of a semiconductor memory device, said memory device having a memory cell array including a plurality of cell blocks, a plurality of pairs of bit line sense amplifier arrays, each of said pairs of bit line sense amplifier arrays being connected to a corresponding one of said cell blocks, and a column decoder for decoding a column address of A bits to generate $2^A$ outputs, comprising the steps of:

selecting $2^M$ bit line sense amplifiers in each of said bit line sense amplifier arrays in response to an output signal from said column decoder;

grouping the selected $2^M$ bit line sense amplifiers into $2^B$ using $2^B$ horizontal bit line sense amplifier group selection lines;

connecting $2^B$ vertical bit line sense amplifier group selection lines respectively to said $2^B$ horizontal bit line sense amplifier group selection lines in response to a block selection signal; and decoding B bits of said column address to generate $2^B$ bit line sense amplifier group selection signals and transferring the generated $2^B$ bit line sense amplifier group selection signals to said $2^B$ horizontal bit line sense amplifier group selection lines through said $2^B$ vertical bit line sense amplifier group selection lines, respectively.

9. A method for enlarging a metal line pitch of a semiconductor memory device, as set forth in claim 8, wherein said $2^B$ vertical bit line sense amplifier group selection lines are connected respectively to said $2^B$ horizontal bit line sense amplifier group selection lines by MOS transistors.

10. A method for enlarging a metal line pitch of a semiconductor memory device, as set forth in claim 8, wherein said $2^B$ vertical bit line sense amplifier group selection lines are connected respectively to said $2^B$ horizontal bit line sense amplifier group selection lines with respect to each of said bit line sense amplifier arrays.

11. A method for enlarging a metal line pitch of a semiconductor memory device, as set forth in claim 10, wherein said $2^B$ vertical bit line sense amplifier group selection lines are connected respectively to said $2^B$ horizontal bit line sense amplifier group selection lines by MOS transistors.

12. A metal line pitch enlargement apparatus for a semiconductor memory device, said memory device having a memory cell array including a plurality of cell blocks, a plurality of pairs of bit line sense amplifiers arrays, each of said pairs of bit line sense amplifier arrays being connected to a corresponding one of said cell blocks, and a column decoder for decoding a column address of A bits to generate $2^A$ outputs, comprising:

data bus lines connected to one of said pairs of bit line sense amplifier arrays;

first transfer means for transferring data amplified by a plurality of bit line sense amplifiers, said first transfer means connected in said bit line sense amplifier; and second transfer means for transferring the data transferred through said first transfer means to data bus lines, said second transfer means connected between said transfer means and said data lines.

* * * * *

UNITED STATES PATENT AND TRADEMARK OFFICE
CERTIFICATE OF CORRECTION

PATENT NO. : 5,923,607
DATED : July 13, 1999
INVENTOR(S) : Jung Won SUH

It is certified that error appears in the above-identified patent and that said Letters Patent is hereby corrected as shown below:

Claim 1, line 40, column 7, replace " $2^6$ " with --$2^B$--

Signed and Sealed this

Thirtieth Day of November, 1999

Attest:

Q. TODD DICKINSON

*Attesting Officer*   *Acting Commissioner of Patents and Trademarks*